United States Patent [19]

Seiler

[11] 4,107,588
[45] Aug. 15, 1978

[54] MULTIPLE TIMING INTERVAL INTEGRATED CIRCUIT STRUCTURE

[75] Inventor: Hartmut Seiler, Reutlingen, Germany

[73] Assignee: Robert Bosch GmbH, Stuttgart, Germany

[21] Appl. No.: 776,422

[22] Filed: Mar. 10, 1977

[30] Foreign Application Priority Data

Apr. 24, 1976 [DE] Fed. Rep. of Germany ....... 2618028

[51] Int. Cl.² ............................................ H02H 7/085
[52] U.S. Cl. ............................. 318/484; 318/DIG. 2; 318/443
[58] Field of Search ............................. 307/443, 294; 318/DIG. 2, 443, 484, 453

[56] References Cited

U.S. PATENT DOCUMENTS

| 3,293,569 | 12/1966 | Englund, Jr. et al. | 331/113 R |
| 3,407,345 | 10/1968 | Fruehauf et al. | 318/443 |
| 3,578,988 | 5/1971 | Slowikowski | 307/294 |
| 4,011,927 | 3/1977 | Smith | 307/294 |

Primary Examiner—David Smith, Jr.
Attorney, Agent, or Firm—Flynn & Frishauf

[57] ABSTRACT

To provide for multiple timing intervals in an entirely integrated circuit structure without replacement of external circuit components, the integrated circuit includes at least two charge resistors and two discharge resistors, each connected to the timing capacitor, and selectively controllable switches connected to the timing capacitor and to the charge and discharge resistors to interconnect the timing capacitor with respective charge and discharge resistors and the input terminals to the timing circuit, as commanded by the respective switch setting. The switches, preferably, are transistor switches which are externally controllable by enabling respective inputs to the integrated circuit structure.

12 Claims, 1 Drawing Figure

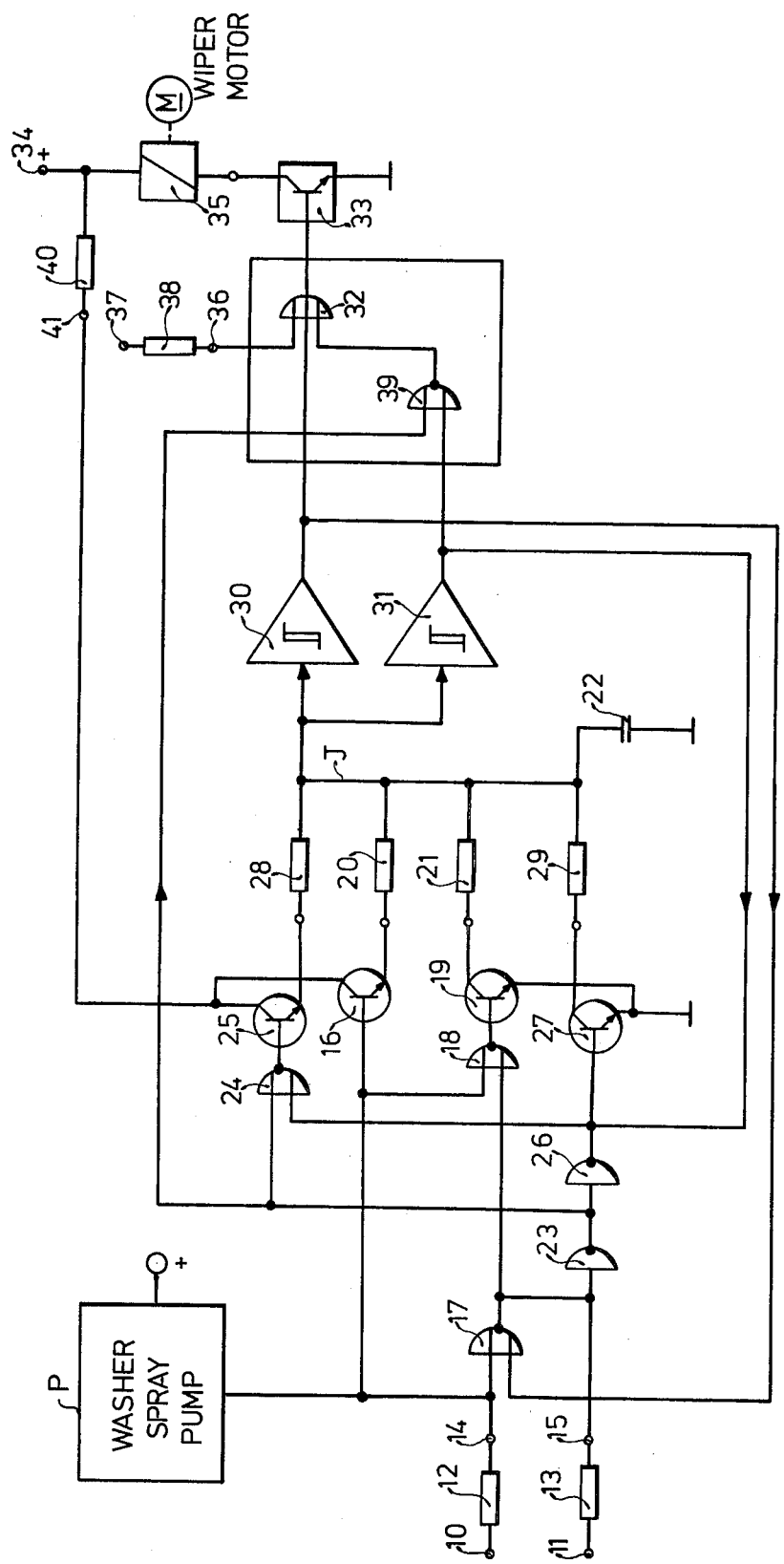

MULTIPLE TIMING INTERVAL INTEGRATED CIRCUIT STRUCTURE

The present invention relates to a timing circuit in integrated circuit form in which the timing duration or time constant is determined by a charge capacitor, and charge and discharge networks connected thereto.

Timing circuits having a charge capacitor are well known; the charge capacitor is associated with charge and discharge resistors, or with a single resistor which forms, simultaneously, the charging or discharging resistor therefor. Any one of the resistors may, also, be the short circuit path of a switch. If various time constants are required in one timing circuit, which time constants are determined by the respective charge and discharge time of the capacitor, then it was customary to include a plurality of resistor-capacitor arrangements with the circuit. This is difficult to realize in integrated circuits since the capacitor component cannot readily be made part of the integrated circuit structure, that is, cannot be integrated with the remainder of the circuit. Accordingly, integrated circuit elements in accordance with a state of the are utilize a plurality of capacitors which were externally connected into the network if different or multiple time constants and timing intervals from the circuit were required.

It is an object of the present invention to provide a timing circuit having a plurality of time constants which can be built as an integrated circuit structure, which has a minimum of externally connected components, or requires a minimum of external connection and which, preferably, utilizes only a single capacitor, although the time constants or timing intervals of the circuit can be externally controlled.

Subject matter of the present invention: Briefly, the capacitor is connected in a circuit which has at least two charge and discharge resistors associated therewith which are selectively connected to the capacitor by controlled switches.

In accordance with a feature of the invention, the control of the controlled switches is commanded by comparators which are connected to the switches associated with the respective discharge resistors.

Selected ones of the charge and discharge systems can be constructed to have a priority or dominant function by associating a logically connected blocking circuit therewith so that the subordinate system is blocked when the dominant system controls the respective charge and discharge phases of its associated resistor-capacitor network to be effective. In a preferred form, the output of the comparator of a dominant system as well as the input of the dominant system is itself connected to the blocking logic circuitry, the output of the blocking logic circuitry being connected to the subordinate or low-priority system to block its effectiveness while the charge and discharge phases of the dominant system proceed.

The system in accordance with the present invention has the advantage that a single integrated circuit can be used for a selected number of possibly mutually different timing functions by external connection to a capacitor and, possibly, also to resistors. The circuit structure can be used, for example, in automotive vehicular technology. One application would be to use the circuit as an interval timer for intermittently operated windshield wiper systems, as well as for a combined wiper-washer operation of the windshield cleaning system. Other possible uses in automotive applications are, for example, the control of direction blinkers, rearview window heating, pre-heating of glow plugs in Diesel engines, cold-starting fuel enrichment, and the like. A single standard integrated timing circuit structure thus can be used and made which, in dependence on the particular application, can be externally connected into extraneous resistance and other networks and can be programmed by connection to such external resistors to thus provide an inexpensive and simple control unit for timing sequences of time-controlled operating steps or modes.

Drawing, where the single FIGURE illustrates, in schematic circuit diagram form, an example of an integrated circuit timing structure for multiple timing intervals.

Two input terminals 10, 11 (see the FIGURE) are provided to which respective ON-OFF signals can be applied to control two different time-dependent parameters. The input terminals 10, 11 are connected over respective current limiting resistors or protective coupling resistors 12, 13 to two input terminals 14, 15 which form the input terminals themselves of the integrated circuit. Terminal 14 is connected to the control input of a first electronic switch 16, formed as an npn transistor; terminal 14 is further connected through the series circuit formed by a first NOR-gate 17 and a second NOR-gate 18 to the control input of a second electronic switch 19, also formed as an npn transistor. Terminal 14 is additionally directly connected to a second input of the second NOR-gate 18. The emitter of the first switching transistor 16 is connected to a first charge resistor 20, the other terminal of which is connected to a common junction J. The common junction J is connected to one terminal of a timing or main capacitor 22, the other terminal of which is connected to a source of reference potential, such as ground or chassis. The collector of the second switching transistor 19 is connected through discharge resistor 21 with common junction J.

The switches 16, 19, resistors 20, 21, together with capacitor 22 form a first charge-discharge system, that is, an internal timing unit having a predetermined time constant, for example a first time constant for a charge mode of the capacitor 22 and a first discharge timing constant for the discharge mode of the capacitor 22.

Terminal 15, series connected to input resistor 13, is connected to a series circuit formed of an inverter 23 and a third NOR-gate 24, the output of which is connected to the control input of a third npn switching transistor. The output of the first inverting stage 23 is connected over a second inverter 26 to the control input of a fourth npn switching transistor 27.

The control input, that is, the base connection of the switching transistor 27 is connected to a further input of the third NOR-gate 24. The emitter of the third switching transistor 25 is connected to a second charge resistor 28, the other terminal of which is connected to junction J. The collector of switching transistor 27 is connected through resistor 29 to junction J.

Switching transistors 25, 27, resistors 28, 29, and the capacitor 22 form a second charge-discharge system, that is, a second internal timing unit with predetermined second charge and discharge timing. The junction J is connected to an input, each, of a comparator 30, 31. The output of the first comparator 30 is connected to a second input of the first NOR-gate 17. The output of the second comparator 31 is connected to the control input of the fourth swtiching transistor 27, and hence also to the second input of NOR-gate 24. The output of the first comparator 30 is additionally connected through an OR-gate 32 with the control input of a fifth electronic switch 33, formed as an npn transistor. The positive terminal of a source of supply 34 is connected through the series circuit of the control or solenoid winding of a relay 35 with the collector-emitter path of the transistor 33. Any other load, or switching circuit can be connected instead of the solenoid or relay winding 35, the relay winding illustrating only one form of use, or load circuit.

Relay 35 can also be directly controlled without intervention of a timing interval. A further terminal 36 is provided, connected to the OR-gate 32. Terminal 36 is enabled by providing a suitable potential to input terminal 37, connected through a coupling, or current limiting resistor 38 to terminal 36.

The first charge-discharge system 16, 19, 20, 21 has the first comparator 30 associated therewith. This system is constructed to be the dominant or priority system. If an input signal is applied to terminal 10, or 14, respectively, any signal applied to terminal 11, or 15 is ineffective. To provide for the priority effect, the output of the second comparator 31 is connected over a fourth NOR-gate 39 with a third input of the OR-gate 32. Additionally, the output of the first inverter 23 is connected with a second input of the fourth NOR-gate 39. The output of the first NOR-gate 17 is connected to the input of the first inverter 23. The result is a logical connection which blocks input signals at terminals 11 or 15 if terminals 10, 14 are enabled.

The positive terminal 34 from a source of supply is connected through a coupling, or current limiting resistor 40 to a fourth input terminal 41 which is connected to the collectors of the switching transistors 16 and 25. The emitters of the switching transistors 29, 27 are connected to ground or chassis.

Operation: The logic elements are so constructed that, upon simultaneous occurrence of a 0-signal or a 1-signal at any point, the 0-signal is predominant. The system can also be constructed with the inverse effect, that is, in which the 1-signals prevail. In that case, the logic circuit has to be somewhat modified, as well known. The corresponding logic functions then are realized with other logic circuit elements. The various switching possibilities can be graphically represented in a Karnaugh diagram, and then can be selected as desired. For illustration, the customary concepts of 1-signals and 0-signals are used, that is, a 1-signal has a magnitude which is in the order of the positive voltage used for the circuit; a 0-signal is approximately reference, or ground voltage.

Application of a 1-signal to terminal 10, or 14, respectively, for example generated by an external command, or applying, through an external switch, a signal from positive terminal 34 to terminal 10, causes opening of the first switch 16, and consequently charging of capacitor 22 over the first charge resistor 20. Discharge over the associated discharge resistor 21 and the second switch 19 is not possible since the second switch 19 is blocked from terminal 14 due to presence of the second NOR-gate 18 which is blocked. If the upper threshold level of the first comparator 13 is reached, or exceeded, and the 1-signal at the terminal 14 terminates, then the 1-signal is available at the output of comparator 30 and applied as a 1-signal to the NOR-gates 17, 18 acting as inverters to close the second switch 19 and start discharge of capactior 22 over the first discharge resistor 21 and the second switch 19. After termination of the 1-signal at terminal 14, the first switch 16 is blocked, thus preventing further charging of capacitor 22. When the voltage of capacitor 22 drops below the lower threshold value of comparator 30, the output of comparator 30 again will have a 0-signal appear thereon so that the two NOR-gates 17, 18 will block switch 19, thus effectively terminating the discharge cycle. During the duration of the 1-signal at the output of comparator 30, OR-gate 32 of the fifth switch 33 is closed and the relay 35, or other load, is operated.

During the time that a 1-signal is applied to terminal 14, or when a 1-signal is available at the output of comparator 30, the output of the first NOR-gate 17 will have a 0-signal thereon. This 0-signal is inverted by the first inverter stage 23 to a 1-signal and is applied to an input of the fourth NOR-gate 39, the output of which will provide a 0-signal. This 0-signal, at the output of the fourth NOR-gate, will persist independently of the output of the second comparator, that is, whether the second comparator 31 has a 0-signal or a 1-signal thereon. The fourth NOR-gate thus excludes the influence of the second comparator 31 and disables its switching action.

If the terminals 11, or 15, respectively, have a 1-signal applied, then the first switch 25 is closed through the first inverter 23 and the third NOR-gate 24, acting as an inverter. Capacitor 22 is charged over the second charge resistor 28. The electronic switch 27 associated with the discharge resistor 29 is blocked at that time, since a 0-signal is applied from the second comparator 31 to the control input of switch 27. The voltage across capacitor 22 will rise until the upper threshold level of the second comparator 31 is reached, and the output thereof will have a 1-signal thereon. This 1-signal is connected through the NOR-gate 24 to block the third switch 25 and cause conduction of the fourth switch 27, permitting discharge of capacitor 22 through discharge resistor 29. Discharge will persist until the lower threshold level of the second comparator 31 is attained, or passed. Since the output of the second comparator again has a 0-signal applied, the third switch 25 becomes conductive and the fourth switch 27 will block. This cycle will repeat for the time that a 1-signal is applied to terminal 11, or 15, respectively. The 1-signal at terminal 15 is made ineffective by the 0-signal at the output of the first NOR-gate 17, ineffective only if a 1-signal is applied to terminal 10 or 14, or if the output of the first comparator 30, due to such a 1-signal at terminals 10 or 14, has a 1-signal at its output. The input signal at terminal 10 thus is the dominant one and has priority over, or dominates the input signal on terminal 11.

The threshold level circuits 30, 31 form threshold comparators. In operation, the outputs of the comparators 30, 31 to the fifth switch 33 are blocked by the signals applied to terminals 10, 14, with respect to the first comparator 30, or by the fourth NOR-gate 39 with respect to comparator 31. If, however, the terminals 10, 14 have a 0-signal applied and the terminals 11, 15 a 1-signal, then the fourth NOR-gate 39 is not blocked and signals from the output of the second comparator 31 can control the fifth switch 33. The upper threshold level of the first comparator 30 is set to be above the upper threshold level of the second comparator 31 so that during the time that the fifth switch 33 is controlled from the output of the second comparator 31, the output of the first comparator 30 will have a 0-signal, to ensure that control is transferred to the second comparator 31.

The circuit as described can be completely integrated. The charge and discharge resistors 20, 21, 28, 29 as well as capacitor 22 are preferably connected as discrete elements to the integrated circuit structure to permit external programming and connection of the timing circuit, and external adjustment of timing periods by adjusting the values of the respective circuit elements. The coupling, or current limiting resistors 12, 13, 38, 40, as well as the load, typically a relay 35, are external to the timing circuit. The coupling resistors 12, 13, 38, 40 need not necessarily be provided for all structures. If the overall circuit arrangement permits, they may be omitted, or selectively omitted. The supply voltage 34 preferably is a stabilized voltage which may include a protective circuit to prevent over-voltages and to protect the integrated circuit element. The integrated circuit may include the additional circuit elements to provide a stabilized voltage supply in one unit. The integrated circuit can be combined with other integrated circuits; it can additionally be expanded by providing further charge-discharge system, each of which including a charge and discharge resistor and associated electrical control switches, similar to the systems 16, 20, 21, 19; 25, 28, 29, 27. Including such further charge-discharge systems in the network by use of further logic circuits will result in connections analogous to those described; the dominating system can be selected as desired.

The circuit arrangement as described is particularly suitable for programmed and timed control of the windshield cleaning arrangement in automotive vehicles. For such operation, terminal 10 will have a signal applied thereto controlling windshield washing and wiping combined. A signal at terminal 10 first commands operation of a windshield washer pump. After the delay due to the charge time commanded by resistor 20, the windshield wiper motor is operated for the time set by the discharge time constant controlled by resistor 21. Terminal 11 can have the signal applied for interval operation, that is, intermittent operation of the windshield wiper motor.

If several loads or use circuits 35 are used, so that a plurality of switches 33 have to be provided, the outputs of the respective comparators can then be connected either directly with the control inputs of the respective electric switches or additional comparators can be provided connected to logic gates and then connected to the respective control inputs of the respective switches.

The logic interconnection of the outputs of the comparators can be effected in various ways; rather than selecting an OR-gate 32, as shown in the drawing, one or more AND-gates can be used which, selectively, may have direct and inverting inputs. Thus, control of switch 33 will be effective only if a certain predetermined combination of output signals derived from the comparators is provided. If a larger number of comparators is used, or, respectively, charge-discharge systems, a portion of the comparator outputs and the AND-gates, and OR-gates, can be so arranged that a portion of the comparator outputs is connected through logically interconnected AND-gates, and another portion over OR-gates, the various individual comparators of the various portions again being individually interconnected by logical gates to effect output in accordance with a certain predetermined programmed logic.

Various changes and modifications may be made within the scope of the inventive concept.

I claim:

1. Multiple timing interval integrated timing circuit structure comprising
   a plurality of input terminas (10, 11) of which, selectively, a signal applied to a first terminal (10) has priority over a signal applied to another terminal (11);
   a main timing capacitor (22), the charge and discharge time of the timing capacitor determining the timing intervals;
   at least two charge resistors (20, 28);
   at least two discharge resistors (21, 29) each associated with a respective charge resistor;
   at least two selectively controllable charge switches (16, 25), each, respectively, connected to a respective charge resistor (20, 28) and to said timing capacitor (22);
   at least two selectively controllable discharge switches (19, 27) each connected to a respective associated discharge resistor (21, 29) and to the timing capacitor (22);
   a charge resistor (20, 28), a controlled charge switch (16, 25), a discharge resistor (21, 29) and a controlled discharge switch (19, 27), together with the timing capacitor (22) forming a charge/discharge system;
   at least two comparators (30, 31), said comparators having respectively different threshold levels, each associated with a charge/discharge system and connected to the timing capacitor (22), the comparators determining the charge voltage across the timing capacitor (22) and providing respective output signals when the voltage across the timing capacitor changes with respect to upper and lower threshold levels of said comparators;
   the output of at least one comparator (30) being connected with the control input of that one discharge switch (19) which is associated with the discharge resistor (21) of the charge/discharge system connected to the terminal (10) having assigned the highest priority;
   an interlock logic circuit (17) disabling that one of said charge/discharge systems connected to the terminal (11) having subordinate priority,
   and wherein the charge/discharge system (16, 20, 19, 21, 22) connected to the higher priority terminal (10) has the output of the associated comparator (30) thereof connected to the interlock logic circuit (17) so that the system (25, 28, 27, 29; 22) having subordinate priority will be blocked during the charge and discharge phases of the system having dominance, or priority.

2. Structure according to claim 1, wherein the charge and discharge resistors (20, 28; 21, 29) and the timing capacitor (22) are external discrete components, and said selectively controllable switches form at least part of an integrated circuit structure, interchange of the external discrete components permitting change of the timing periods to pre-program the timing periods of said structure.

3. Structure according to claim 1, wherein each charge resistor (20, 28) has an input terminal (10, 11) of the structure associated therewith.

4. Structure according to claim 1, further comprising a logic circuit (18; 31) connected to the charge control switch (16, 25) and having an output controlling the discharge control switch to disable or block the discharge control switch (19, 27) when an input signal is applied to the terminal enabling the respective charge control switch.

5. Structure according to claim 1, wherein the charge/discharge control system (25, 28, 27, 29, 22) and the associated comparator (31) is connected with the respective charge control switch (25) and discharge control switch (27) to form a multivibrator circuit triggered by an input signal at the respective input terminal (11, 15) of the charge/discharge system.

6. Structure according to claim 1, wherein the logic circuit (17) interconnects said at least two charge/discharge systems (16, 20, 19, 21, 22; 25, 28, 27, 29, 22) and is connected to block one system when the other system is enabled.

7. Structure according to claim 1, further comprising an output control switch (33) having a control input;
a control switching logic (32) connecting the outputs of said at least two comparators (30, 31) to the control input of the output control switch (33), the control switching logic alternatively controlling said output control switch (33);
and means (34) connecting a load (35) to said switch (33).

8. Structure according to claim 7, wherein one of said input terminals (36, 37) is directly connectable through said control switching logic to directly control said output control switch and bypassing the timing charge/discharge systems.

9. Structure according to claim 7, wherein the logic circuit further comprises a logic switching element (39) connected between the control switching logic (32) and the output of the comparator (31) of the charge/discharge system (25, 28, 27, 29; 22) connected to the terminal having subordinate priority.

10. In a windshield cleaning system for automotive vehicles, a windshield wiper motor (M), a washer spray pump (P),
and comprising the system of claim 1,
energization of one of said input terminals (10) energizing said washer spray pump (P) and, after elapse of the charge time of said timing capacitor (22), operation of the wiper motor (M) during the time controlled by the discharge resistor (21).

11. In a windshield cleaning system for automotive vehicles, a windshield wiper motor (M), a washer spray pump (P),
and comprising the system of claim 1,
energization of one of said input terminals (10) energizing said washer spray pump (P) and, after elapse of the charge time of said timing capacitor (22), operation of the wiper motor (M) during the time controlled by the discharge resistor (21);
and wherein another one of said input terminals (11), when enabled, commands intermittent operation of said wiper motor (M) with the intervals, and operating time determined by the respective charge and discharge time constants of the other of said systems.

12. System according to claim 11, wherein a further one of said input terminals (36, 37) is connected to directly control operation of said wiper motor (M) to command continuous operation of said wiper motor independently of said timing circuit.

* * * * *